United States Patent
Hönigschmid et al.

(10) Patent No.: US 6,741,513 B2
(45) Date of Patent: May 25, 2004

(54) DATA MEMORY WITH A PLURALITY OF MEMORY BANKS

(75) Inventors: Heinz Hönigschmid, Essex Jct., VT (US); Gerhard Müller, Hopewell Junction, NY (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/001,176

(22) Filed: Nov. 2, 2001

(65) Prior Publication Data

US 2002/0114206 A1 Aug. 22, 2002

(30) Foreign Application Priority Data

Nov. 3, 2000 (DE) .......................................... 100 54 520

(51) Int. Cl.[7] ............................. G11C 8/00; G11C 11/00
(52) U.S. Cl. ............................. 365/203.03; 365/230.06; 365/158
(58) Field of Search ..................... 365/230.03, 230.06, 365/158, 214

(56) References Cited

U.S. PATENT DOCUMENTS

| | | | | |
|---|---|---|---|---|
| 3,825,907 A | * | 7/1974 | Sell et al. ................... | 365/214 |
| 5,306,935 A | | 4/1994 | Esquivel et al. ............. | 257/315 |
| 5,852,574 A | * | 12/1998 | Naji ........................... | 365/158 |
| 5,920,500 A | | 7/1999 | Tehrani et al. .............. | 365/173 |
| 6,128,214 A | * | 10/2000 | Kuekes et al. .............. | 365/158 |
| 6,130,852 A | * | 10/2000 | Ohtani et al. .......... | 365/230.03 |
| 6,226,214 B1 | * | 5/2001 | Choi ..................... | 365/230.03 |

* cited by examiner

*Primary Examiner*—Trong Phan
(74) *Attorney, Agent, or Firm*—Laurence A. Greenberg; Werner H. Stemer; Ralph E. Locher (57) ABSTRACT

The data memory has a plurality of banks, each with a multiplicity of memory cells that form a matrix of rows and columns with respectively assigned matrix row lines and column lines. The banks are arranged spatially one on top of the other as stacks, with the stack edges that are parallel to the matrix rows and at which the ends of the column lines that are connected to a respective column-driving device are located, lie in a common plane. The common plane extends in the direction of the matrix rows and is substantially orthogonal with respect to the direction of the columns. The column-driving devices of all the banks are arranged directly adjacent to one another as a block in the direction of the columns, on or near the same edge of the bank stack. The banks preferably contain memory cells which can be read out without damage, and in each case a plurality of column lines are each assigned to one common sense amplifier in the column-driving device of each bank.

5 Claims, 4 Drawing Sheets

DATA MEMORY WITH A PLURALITY OF MEMORY BANKS

BACKGROUND OF THE INVENTION

Field of the Invention

The invention lies in the memory technology field and pertains, more specifically, to data memory with a plurality of banks. Each of the plurality of banks contains a multiplicity of memory cells which form a matrix-shaped array of rows and columns with respectively assigned row lines and column lines. The row lines of each bank can be activated selectively, and the column lines of each bank are connected to a column-driving device which is assigned to the respective bank and which contains, for each column line, a column selection switch that can be switched on selectively and which, in the switched-on state, transmits, from or to an associated column-connecting node of a data line network, the data value which is to be written on the respective column line or read out.

Data memories which are constructed using solid state technology and are designed for random access (generally referred to as RAMs) usually contain a plurality of "banks" each composed of a multiplicity of memory cells, each bank forming a matrix-shaped arrangement of rows and columns with respectively assigned matrix row lines and column lines. The matrix row lines of each bank are connected to a group of matrix row line drivers which are assigned to the respective bank. The column lines of each bank are connected to a column-driving device which is assigned to the respective bank and which contains, inter alia, a column-selection switch which can be switched on selectively for each column line. It is thus possible to address each memory cell of a bank in a uniquely defined fashion by driving a specific matrix row line and switching on a specific column-selection switch.

In order to write an item of information into a desired memory cell or read an item of information from it, the matrix row line which is assigned to the matrix row containing the respective cell is activated by a specific level being applied by a matrix row address decoder, as a result of which all the cells of this matrix row are prepared for possible access (matrix row addressing). The actual access is then made by that column-selection switch which is assigned to the column containing the desired memory cell and is switched on by a column-address decoder (column addressing). For the purpose of writing, a data value, i.e. a current level or voltage level which represents the information to be written is applied to the respective column line. For the purpose of reading, the data value which is stored in the selected cell and is connected to the respective column line from this memory cell on the basis of the activated matrix row line is sensed at this column line by means of a sense amplifier.

The memory cells of currently customary dynamic RAMs (generally referred to as DRAMs) store the information capacitively, i.e., in the form of electrical charge which has to be refreshed at short time intervals owing to its highly volatile nature and which is additionally used up during reading. In order to restore the memory state, damaged in this way, of such a cell after the reading operation, the sensed data value is buffered ("latched") in the column amplifier in order to, on the one hand, write it back from there into the respective cell and, on the other hand, transmit it to a common bidirectional data port of the memory via a data line network. When a matrix row line has been activated, the data values of all the memory cells of the respective matrix row are usually simultaneously sensed and latched by the column amplifier and the latched data values are then successively transmitted via the data line network to the data port of the memory. This operation and the continuously necessary refreshing of the memory contents requires a separate sense amplifier for each column, at the end of the respective column line. The sequential transmission of the data values between the individual sense amplifiers and the data line network is carried out by means of corresponding sequential driving of the column-selection switches.

As a result of the splitting up of the overall quantity of memory cells of a RAM memory into a plurality of banks which can be operated independently of one another, the data rate can be increased. If each data bank has its own row- and column-driving means, the banks can be operated virtually in parallel with one another in order to conceal the unavoidable delays which result from the development period of the signals. In the case of banks which can be operated independently, it is possible, for example, for a column access to a bank to be already started while another bank is still in the stage of the signal development for the reading operation. In this way, data values which are to be written to various memory cells or read out from them can be transmitted to or from the data port of the memory via the data line network at much shorter time intervals.

The problem with such a multi-bank architecture of a memory is posed by differences in signal transit times owing to signal paths of different lengths between the column-driving devices of various banks and the common data port. If more than two banks are present, it is unavoidable that cases will occur wherein the distances from the data port to two different column-connecting points of the data line network will deviate from one another by more than the dimension of one column length (length of a bank) or of one matrix row length (width of a bank), which can lead to differences in signal transit times of several nanoseconds. Given the previous multi-bank memories, it is therefore necessary to adjust the exact timing of driving signals within a correspondingly wide framework. This is often achieved with self-timing signals, i.e. the system waits until a data signal has reached its final state at the point which is farthest away from the data port, and only then does it begin to process the rest of the signal sequence. In other, more general terms: in order to take into account the aforethe differences in signal transit times there must be a corresponding degree of room for maneuver in the cycles of the clock with which the data values are clocked over the common data line. This restricts the maximum possible data rate. In addition, the speed of a changeover between writing mode and reading mode is restricted by the absolute signal transit time between the data port and the column-connecting point of the data line network which is furthest away.

SUMMARY OF THE INVENTION

It is accordingly an object of the invention to provide a data memory device with a plurality of memory banks, which overcomes the above-mentioned disadvantages of the heretofore-known devices and methods of this general type and wherein the differences in the line lengths between the common data port and the various column-connecting points of the data line network are smaller than hitherto and wherein the line length between the data port and the column-connecting point lying farthest away is smaller than hitherto.

With the foregoing and other objects in view there is provided, in accordance with the invention, a data memory device, comprising:

a plurality of memory banks each containing a multiplicity of memory cells arranged in a matrix array of rows and columns and having respectively assigned matrix row lines and column lines, whereby the matrix row lines of each memory bank are selectively activatable;

column-driving devices connected to ends of the column lines and each assigned to a respective bank, the column-driving devices having, for each column line, a selectively switchable column selection switch connected to transmit, in a switched-on state thereof, from or to an associated column-connecting node of a data line network, a data value to be written on or read out from the respective column line;

the banks being spatially arranged on top of one another to form bank stacks with edges extending parallel to the matrix rows and having the ends of the column lines connected to the column-driving devices, the edges lying in a common plane extending in the direction of the matrix rows and substantially orthogonally with respect to the direction of the columns; and the column-driving devices of all the banks being disposed directly adjacent one another as a block in the direction of the columns, on or near an edge of the bank stack at which the ends of the column lines connected to the column-driving devices are located.

In other words, the invention is implemented on a data memory with a plurality of memory banks, each of which contains a multiplicity of memory cells which form a matrix-shaped array of rows and columns with respectively assigned matrix row lines and/or column lines, it being possible to activate the matrix row lines of each bank selectively, and the column lines of each bank being connected to a column-driving device which is assigned to the respective bank and which contains, for each column line, a column selection switch which can be switched on selectively and which, in the switched-on state, transmits, from or to an associated column-connecting point of a data line network, the data value which is to be written on the respective column line or read out. According to the invention, the banks are arranged spatially one on top of the other as stacks in such a way that their edges, which are parallel with the matrix rows and at which the ends of the column lines which are connected to the respective column-driving device are located, lie in a common plane which extends in the direction of the matrix rows and essentially orthogonally with respect to the direction of the columns, and in that the column-driving devices of all the banks are arranged directly adjacent to one another as a block in the direction of the columns, on or near that edge of the bank stack at which the ends of the column lines connected to the column-driving devices are located.

With the inventive configuration of the memory banks and of the column-driving devices it is possible, even when a large number of memory banks are used, to reduce the maximum number of differences in lengths of paths over the data line network which have to be allowed for to an amount which is hardly greater than half the matrix row length of a bank. The absolute length of paths between the data port and the column-connecting point which lies furthest away is also reduced. This makes it possible to speed up both the data rate during a writing or reading operation and the change-overs between the writing mode and the reading mode.

In accordance with an added feature of the invention, the memory cells are memory cells which can be read without damage, i.e., the contents are not erased upon reading or their charge is reduced or depleted, and wherein in each case a plurality of column lines are each assigned to one common sense amplifier in a respective column-driving device at each bank, and wherein in each case one column-selection switch is inserted between each column line and the associated sense amplifier.

In accordance with an additional feature of the invention, the column lines are assigned to a sense amplifier in given numbers, and the given numbers are dimensioned such that an overall quantity of all the sense amplifiers are arranged along a row that extends in the direction of the matrix rows and that is no longer than a length of a matrix row, and wherein all the sense amplifiers are arranged next to one another along the edge of the bank stack.

In accordance with another feature of the invention, the memory cells are magnetoresistive memory cells.

In accordance with a concomitant feature of the invention, adjacent banks in the bank stack are each assigned the same matrix row lines or column lines, and planes of the matrix row lines alternate with planes of the column lines in the bank stack.

Other features which are considered as characteristic for the invention are set forth in the appended claims.

Although the invention is illustrated and described herein as embodied in a data memory with a plurality of banks, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

The drawings and the following text contain identical short combinations of upper case letters, after which, for more precise identification, numbers are positioned as "sequential numbers" in square brackets [ ]. These combinations are used as reference symbols for similar hardware elements. Where two numbers are separated by an forward slash (oblique /) inside the bracket, the second indicates the number of the bank to which the respective element is assigned. In the figures, not all the identical elements in a series have been provided with reference symbols, for reasons of space and clarity.

Figure 1:
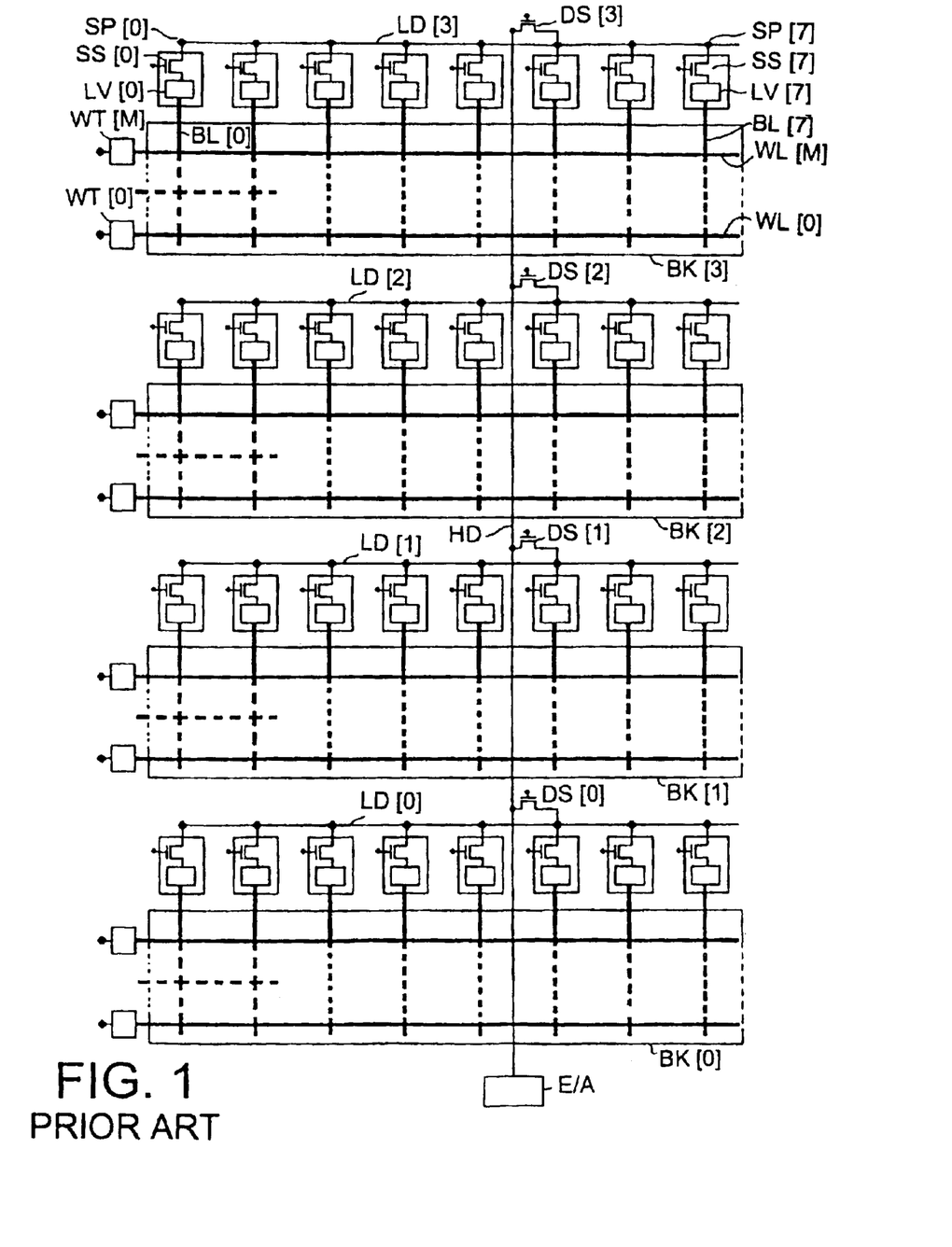
FIG. 1 is a schematic view illustrating the arrangement of a plurality of banks of a data memory according to the prior art.

Referring now to the figures of the drawing in detail and first, particularly, to FIG. 1 thereof, there are shown how a plurality of memory banks with the respectively assigned driving devices are arranged on a common semiconductor chip in a customary layout in accordance with the prior art. Four memory banks BK[0] to BK[3], each containing a multiplicity of memory cells which form a matrix-shaped arrangement of rows and columns and which are located near to the places where assigned matrix row lines and column lines intersect are shown. For reasons of clarity of the drawing, the memory cells are not shown, only matrix row lines (word lines) WL are illustrated as thick horizontal lines and the column lines (bit lines) BL as thick vertical lines.

In order to simplify the figure, each of the banks BK[0] to BK[3] are illustrated with only 8 column lines BL[0] to BL[7], and in practice the number of columns is much higher, usually in the order of magnitude of several hundred. Of the matrix row lines, which can also be several hundred in number in each bank, in each case only the first WL[0] and the last WL[m] are fully illustrated. The intermediate section of the respective bank is merely indicated by dotted lines and is shown very much shortened in scale.

The wiring of the banks shown in FIG. 1 is that of a customary, capacitively storing DRAM. Each column line BL of each bank is connected directly to its own sense amplifier LV. In addition, a driver circuit (word line driver) WT is provided for each matrix row line WL on each bank BK, said driver circuit WT applying, when addressing is performed by a non-illustrated matrix row address decoder, an activation potential to the respective matrix row line in order to condition all the memory cells which are assigned to this matrix row line, for the execution of a writing or reading operation.

For the purpose of reading, the charge state of the memory capacitance of each cell which is conditioned in this way is sensed as a data value via each respective column line BL by means of the assigned sense amplifier LV, regenerated and written back into the cell. Here, the regenerated data value remains latched in the sense amplifier LV and can be coupled, by enabling an assigned column-selection switch SS at an associated column-connecting point SP, to a "local" data line LD which is assigned to the respective bank BK. Each local data line LD is connected via a data line switch DS to a "main" data line HD which leads to the bidirectional input/output data port I/O which is common to all the data banks BK of the memory.

In order to write to a bank BK, the data value which is to be written into a memory cell is coupled from the assigned local data line LD, via the column-selection switch SS assigned to the respective column, into the associated sense amplifier LV whose latch is subsequently set to this data value. As a result, the charge state of the cell is also set to correspond to the aforesaid data value.

The column-selection switches SS and the data line switches DS are schematically shown as field-effect transistors whose source-drain links (channels) form the switching paths and whose gate electrodes receive the control signals for enabling and disabling the switching paths. The column-selection switches SS at each bank BK can be controlled individually by a column-address decoder (not shown) by means of column-selection signals, and the data line switches DS can be controlled individually by a bank-address decoder (not shown) by means of bank-selection signals.

The sense amplifiers LV[0]–LV[7] and column-selection switches SS[0]–SS[7] which are assigned to a bank BK form, in combination, the "column-driving device" of the respective bank. The column-driving devices are arranged on the chip along the edges of the banks BK which are parallel to the rows. In the case illustrated, all the elements LV, SS of the column-driving device of a bank are accommodated on the same side of the bank; in many practical cases, the elements are however distributed on both sides, alternating from column to column.

The access to a memory cell of a bank BK is made by activating the respective word line WL by means of the associated word line driver WT and subsequently switching through in each case two switches, namely the respective column-selection switch SS and the data-line switch DS which connects the local data line LD of the respective bank to the main data line HD. Each writing or reading procedure requires a certain time for developing and calling up signals which correspond to the data values in the sense amplifiers LV. As a result, access operations to the same bank cannot be made in a succession of any desired speed, i.e. the data rate at each individual bank is restricted by the development time of the signals. However, the banks can be operated in parallel so that when k banks are present it is theoretically possible to input and output data at the data port I/O with the k-multiple of the data rate which is possible at the individual banks, as far as the upper limit which is determined by the maximum permissible clock frequency in the data port and in the connected processing circuits. In practice, there is, however, an additional restriction owing to the signal transit times in the data line network, which is made up of the local data lines LD and the main data line HD, as explained below.

As is clear from FIG. 1, the length of the line path between a sense amplifier LV and the data port I/O is composed of two sections: firstly the section of the local data line LD which runs in the direction of the rows and which lies between the column-connecting point SP and the respective data line switch DS, and secondly the section of the main data line HD which runs in the direction of the columns and lies between this data line switch DS and the data port E/A. This overall line path becomes longer or shorter depending on the position of the bank BK and depending on the position of the sense amplifier LV and of the column-connecting point SP in the associated column-driving device. This leads to differences in signal transit times which require a corresponding chronological room for maneuver which inevitably reduces the data rate.

The differences in path lengths in the direction of the rows via the local data lines LD can be reduced to at most half the length of the distance between the two sense amplifiers LV nearest to the edge of a bank BK by arranging the main data line HD and the connecting point of the associated data line switch DS in the center of the bank width. The differences in path lengths in the direction of the columns via the main data line HD can be reduced, if the memory contains more than two banks, to just half of the distance between the column-driving devices nearest to the edge in the overall bank arrangement by arranging the connecting point for the data port I/O in the center between the column-driving devices nearest to the edge. In this case, the maximum difference in path length in the direction of the columns over the main data line HD is an entire column length or more depending on the number of banks. If the banks were to be arranged one next to the other in the direction of the matrix rows, there would be virtually nothing to gain: in this case, the maximum differences in path lengths in the direction of the columns would be smaller, but greater in the direction of the matrix rows.

Figure 2:
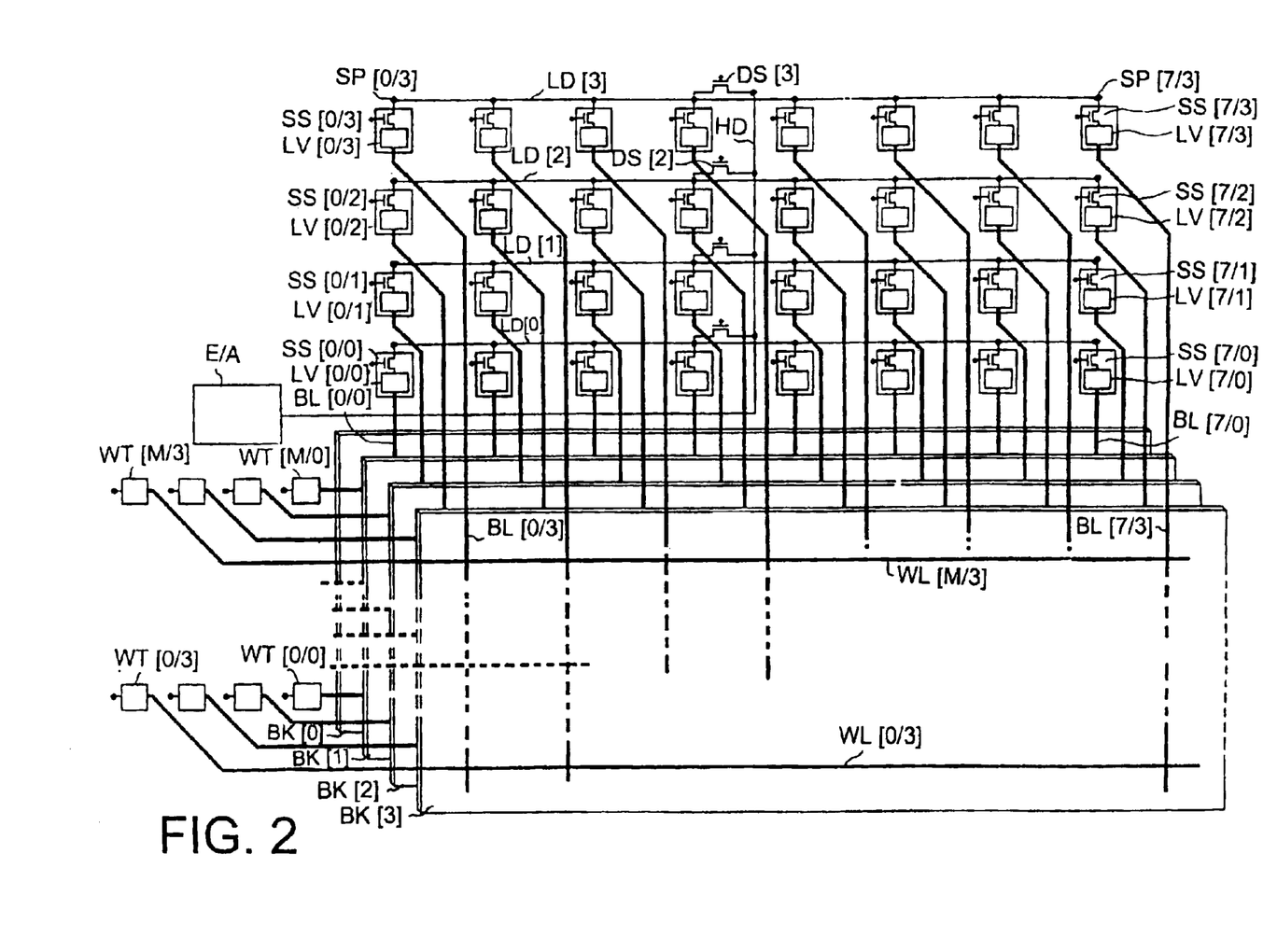
FIG. 2 is a schematic perspective view of a first exemplary embodiment of the layout of a data memory, containing a plurality of banks, according to the invention.
Figure 3:
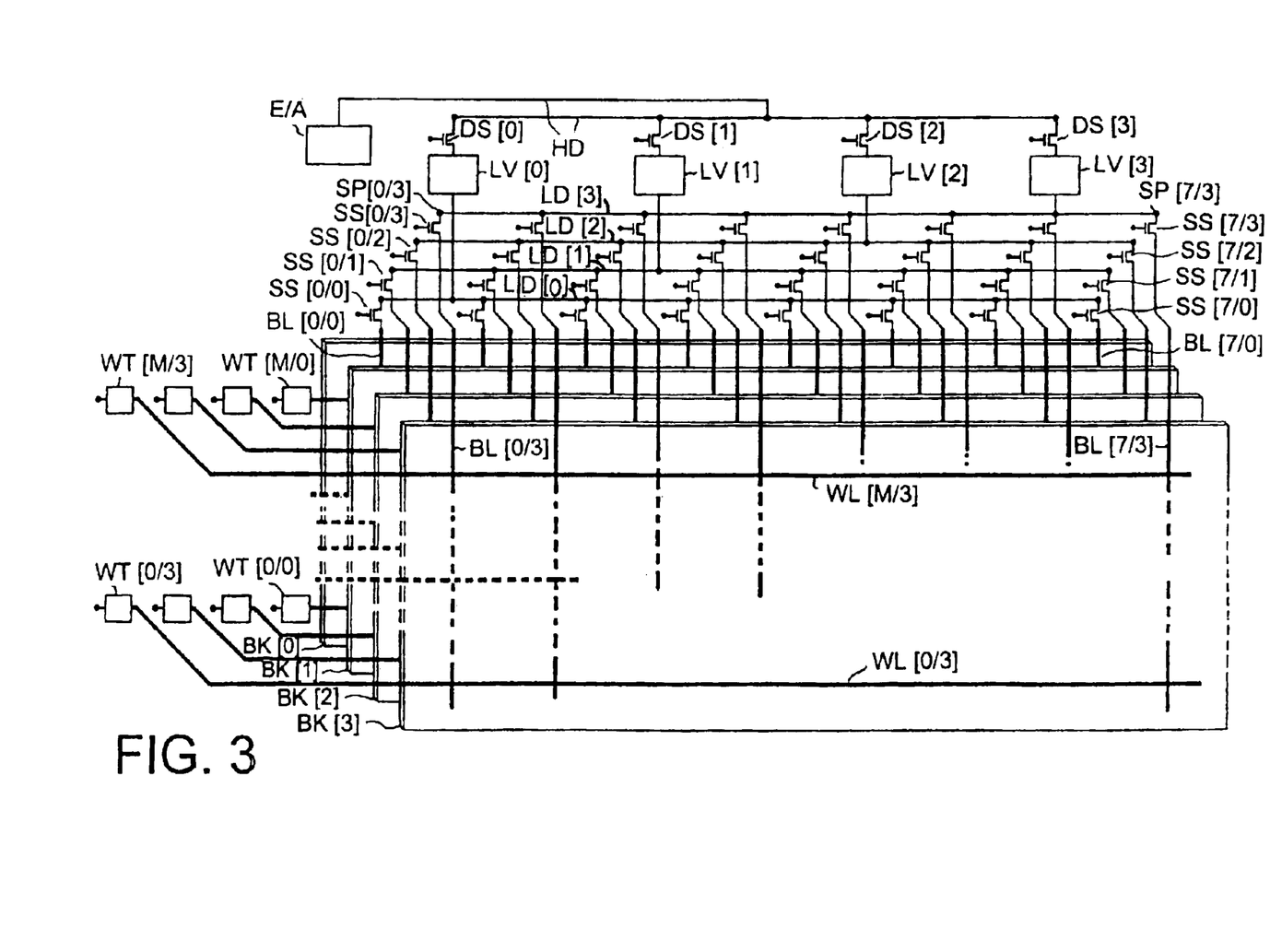
FIG. 3 is a schematic perspective view of a second exemplary embodiment of the layout of a data memory, containing a plurality of banks, according to the invention.

A solution of the problem described above is successfully found with the inventive stacked arrangement of the banks and combination of the column-driving devices of all the banks in one block, as is shown on two exemplary embodiments in FIGS. 2 and 3.

In FIGS. 2 and 3, elements which functionally correspond to individual elements of the arrangement according to FIG. 1 are provided with the same reference symbols as in FIG. 1. The inventive data memory according to FIGS. 2 and 3 also contains four banks, BK[0] to BK[3] with eight column lines BL[0] to BL[7] each, and a multiplicity of matrix row lines WL[0] to WL[m]. However, in contrast to FIG. 1, the banks BK are not arranged in a single plane and one next to the other in the direction of the columns, with the column-driving devices respectively arranged between them. Instead, the banks BK are located in a plurality of planes one on top of the other congruently in such a way that their edges which are parallel to rows and at which the ends, connected to the column-driving devices, of the column-lines BL are located, run along a common plane which extends, on the one hand, in the direction of the rows and, on the other hand, essentially orthogonally with respect to the direction of the columns. In FIGS. 2 and 3, the stack of the banks BK[0] to BK[3] is illustrated in an oblique view perspectively and spaced apart in the direction of the height of the stacks so that all the banks are at least partially visible.

In the text which follows, the embodiment according to FIG. 2 which illustrates a capacitively storing DRAM will be described first. Here, each actual memory bank BK is individually constructed and is to be operated precisely as described in conjunction with FIG. 1 so that further explanation is unnecessary. Only the spatial arrangement of the driving circuits and of the data lines is different from that in FIG. 1.

The word line drivers WT of each bank BK for the selection of matrix rows are all arranged along an edge (on the left in the drawing) which is parallel to the columns and in the case illustrated they are all integrated in the same plane as the first (bottom) bank BK[0] and specifically in four rows which lie one next to the other and parallel to the columns: a first row WT[0/0]-WT[m/0], nearest to the bank stack, for the first bank BK[0], then a second row WT[0/1]-WT[m/1] for the second bank BK[1], a third row WT[0/2]-WT[m/2] for the third bank BK[2] and a fourth row WT[0/3]-WT[m/3] for the fourth bank BK[3].

In a similar way, the column-driving devices LV, SS for the column access are arranged along an edge (at the top of the drawing) which is parallel to the matrix rows, in the case illustrated they are all integrated in the same plane as the first (bottom) bank BK[0] and form four rows, lying directly one next to the other and parallel to the matrix rows, of sense amplifiers LV and column-selection switches SS: a first row which is nearest to the bank stack and has the sense amplifiers LV[0/0]-LV[7/0] and the switches SS[0/0]-SS[7/0] for the bank BK[0], then followed by a second row with the sense amplifiers LV[0/1]-LV[7/1] and the switches SS[0/1]SS[7/1] for the bank BK[1], a third row with the sense amplifiers LV[0/2]-LV[7/2] and the switches SS[0/2]-SS[7/2] for the bank BK[2] and a fourth row with the sense amplifiers LV[0/3]-LV[7/3] and the switches SS[0/3]-SS[7/3] for the bank BK[3]. Each local data line LD runs in the direction of the matrix rows directly next to the associated column-selection switches SS; on the one hand it is connected via column-connecting points SP to all the column-selection switches of the respective bank BK and on the other hand to the main data line HD via the data line switch DS assigned to the respective bank, preferably in each case near to the center (measured in the direction of the matrix row) of the respective column-driving device where the main data line HD runs in the case shown.

It is apparent that, thanks to this arrangement, the maximum difference in path lengths in the direction of the columns between the data port I/O and various sense amplifiers LV is only equal to the distance, measured in the direction of the columns, between the local data line LD[0], nearest to the bank stack, and the local data line LD[3] which is furthest away from the bank stack. This distance is dependent on the overall length, measured in the direction of the columns, of the unit composed of a sense amplifier LV and a column-selection switch SS, and is dependent on the number of column-driving devices or banks BK. Because this overall length is very much smaller than the length of the columns of the banks, a significant improvement of the distance between the path lengths is achieved in comparison with the prior art according to FIG. 1.

This improvement can be increased further if memory cells whose memory content is not highly volatile and is also not used up during reading are used in the banks, so that there is no need for constant refreshing of the memory or for a data value which has been read to be rewritten. In memories of this type, it is possible to assign in each case one sense amplifier to a plurality of column lines so that a smaller number of sense amplifiers is sufficient. It is thus possible to reduce the overall extent, measured in the direction of the columns, of a plurality of combined column-driving devices, that is to say their "integration length in the direction of the columns". The exemplary embodiment of the invention shown in FIG. 3 makes use of this possibility.

The configuration according to FIG. 3 differs from the configuration according to FIG. 2 by virtue of the fact that the banks BK which are stacked one on top of the other are memory banks which can be read without damage (which is not apparent in the figure) and that the column-driving devices which are combined at the edge of the stack which is parallel to the matrix rows are constructed somewhat differently. The column-driving devices are integrated, as in the case of FIG. 2, on the chip in the same plane as the bottom bank BK[0] of the stack, and each column-driving device contains a number of column-selection switches SS corresponding to the number of columns, each of which switches SS is connected to an associated column-connecting point SP of the assigned local data line LD and it is possible for said column-selection switches SS to be driven individually by means of the column-address decoder (not shown). In contrast with the case in FIG. 2, the other side of each of these switches SS is, however, connected directly to the assigned column line BL and just one sense amplifier LV is provided for each bank BK.

In particular, the column-selection switches SS[0/0]-SS[7/1] of the first bank BK[0] form a row which lies nearest to the bank stack and is parallel to the matrix rows. This is then followed, as the distance from the bank stack increases, by the local data line LD[0] for the first bank, the row of the column-selection switches SS[0/1]-SS[7/1] for the second bank BK[1] etc. as far as the local data line LD[3] for the fourth bank BK[3]. Each of the local data lines LD[0]-LD[3] is connected to an associated sense amplifier of four sense amplifiers LV[0]-LV[3] which are arranged in a row parallel to the matrix rows and are connected via in each case one of the four data line switches DS[0]-DS[3] to the main data line HD which leads to the data port I/O.

It is apparent that in the case of FIG. 3, the differences in path length between the data port I/O and various sense amplifiers LV in the direction of the columns are virtually equal to zero, and in the direction of the matrix rows are at maximum equal to half the length of the row of sense amplifiers LV[0]-LV[3] if the branching of the main data line HD is symmetrical to the center of this row, as shown in FIG. 3. Without compromising this advantage it is also possible, in particular with a high number of columns, to provide more than one sense amplifier per bank, in each case one for a group of columns of the respective bank. The numbers of column lines which are each assigned to a sense amplifier are preferably dimensioned such that the overall quantity of the sense amplifiers of all the banks can be arranged as one row which extends in the direction of the matrix rows and which is not longer than the length of one matrix row. The previously customary overall width of sense amplifiers measured in the direction of the matrix rows is, for layout reasons, at most equal to the distance between the columns. If, therefore, the same number of column lines is assigned to each sense amplifier, for example, as the number of banks present in the stack, all the sense amplifiers have enough space, even in their conventional structural form, in one row along the edge of the bank stack which is parallel to the matrix rows.

In a preferred embodiment of the invention, magnetoresistive memory cells are used for the memory banks. Such memory cells can be read out without damage. Such cells are known per se for implementing magnetoresistive nonvolatile RAMs (what are referred to as MRAMs), and their basic design and method of operation are therefore described only briefly below with reference to FIG. 4.

Figure 4:
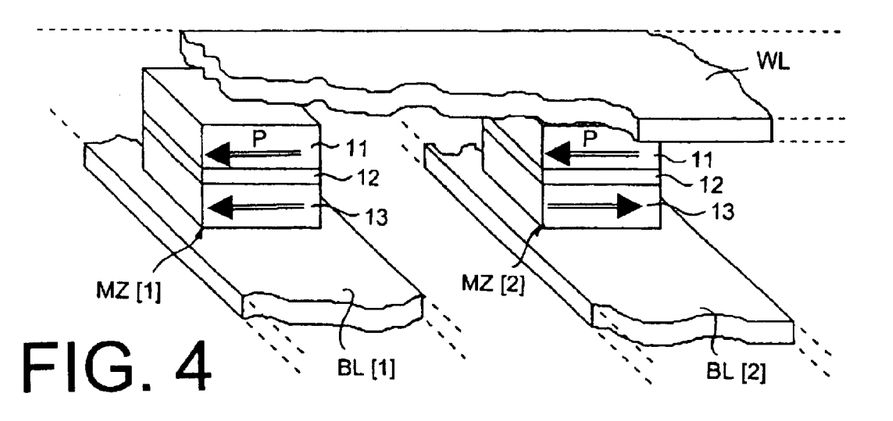
FIG. 4 is a fragmentary perspective view of a memory with magnetoresistive memory cells.

FIG. 4 is a perspective view of a small detail of a MRAM memory matrix which contains only two magnetoresistive memory cells MZ[1] and MZ[2]. Each cell is composed of three layers: an upper layer 11 made of hard magnetic material, a very thin central layer 12 made of insulating material, for example an oxide (tunnel layer) of only a few layers of atoms and a lower layer 13 made of soft magnetic material. The hard magnetic layers 11 of the two cells shown make contact with a common matrix row line WL, and the soft magnetic layers respectively make contact with an assigned column line BL[1] and BL[2], respectively. The hard magnetic layers 11 of all the cells of the matrix are permanently magnetized in one direction indicated by the arrow P. The soft magnetic layers 13 can be remagnetized either in the direction of the arrow P or in the opposite direction.

The information stored in a MRAM cell MZ is determined by the direction of magnetization of the hard magnetic layer 11 in relation to the magnetization direction of the soft magnetic layer 13. Given magnetization which is directed in parallel, as shown by the arrows pointing in the same direction at the cell MZ[1] in FIG. 4, the ohmic resistance via the tunnel layer 12 is low. Given antiparallel magnetization, as shown by the arrows pointing in opposite directions at the cell MZ[2], the resistance via the tunnel layer 12 is considerably higher. The information can thus be read out by sensing the respective resistance value.

For writing purposes, a current in the order of magnitude of 1 to 2 mA is required in the matrix row line WL and in the column line BL of the respective cell MZ. The superimposition of the magnetic fields of these current magnetizes, depending on their polarity which is determined by the information to be written, the soft magnetic layer 13 in one or other direction, as a result of which the information is stored. In order to read out a cell MZ, a voltage of, for example, 0.5 V is applied between the column lines and bit lines assigned to the cell, and the flowing current is measured.

The selective driving of the MRAM memory cells in a plurality of banks can be carried out by means of the arrangement, shown in FIG. 3, of matrix row line drivers WT, column-selection switches SS and sense amplifiers LV. The writing current for a matrix row line WL can be applied via the respective driver WT. The writing current for the column lines BL can be applied by the respective sense amplifier LV by means of the particular column-selection switch SS in accordance with the data value which is to be written and which is received on the main data line HD. The current feedback lines and feedback switches which are necessary for the writing mode are not shown in FIG. 3.

The potential difference for the MRAM read voltage can be generated by the first potential being applied to the selected matrix row line WL by the associated driver WT, while the second potential is applied to the selected column line BL by means of the assigned column-selection switch SS by the connected sense amplifier LV which is constructed in such a way that it responds to the value of the flowing current in order to apply a corresponding data value to the main data line HD.

In the bank stack shown in FIGS. 2 and 3, the memory banks are independent units, i.e. each bank contains its own matrix row lines and column lines for selecting the memory cells. In this case, 2 k metalization planes are therefore required for the selection lines if k is the number of banks. The stack can, however, also be constructed in such a way that adjacent banks alternately share the matrix row lines and the column lines. The necessary number of metalization planes is then smaller. Such a construction, in the form which can be particularly easily implemented with MRAM memory banks, is illustrated in FIG. 5.

Figure 5:
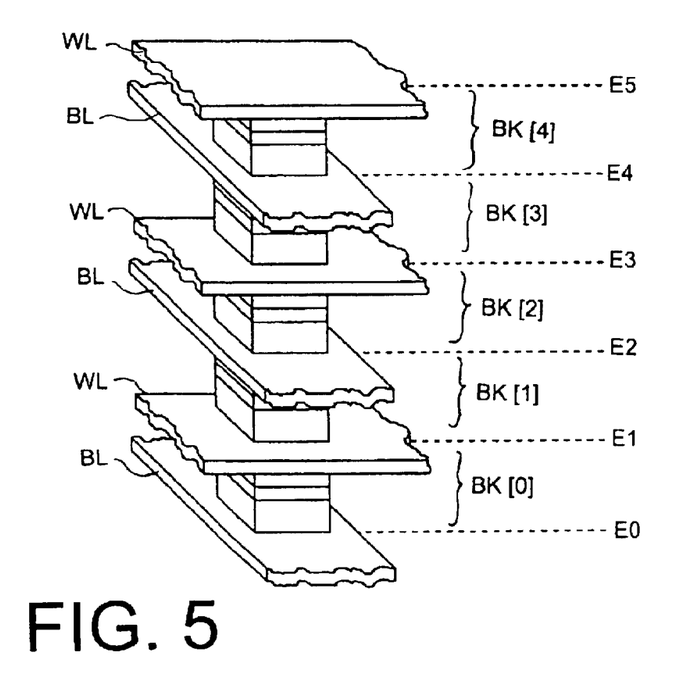
FIG. 5 is a fragmentary perspective detail of a stack of a plurality of memory banks which are laid one on top of the other and are formed with magnetoresistive memory cells.

FIG. 5 shows a perspective view of a small detail from a stack of five MRAM memory banks BK[0] to BK[4], each of which contains a matrix of MRAM cells MZ, as illustrated in FIG. 4 and described with reference to this FIG.. The detail illustrated in FIG. 5 shows only one MRAM cell MZ from each bank in each case.

The first, bottom bank BK[0] of the stack according to FIG. 5 has its own column lines BL in a first metalization plane E0 underneath the cells of this bank. Running over the cells of the first bank BK[0] in a second metalization plane E1 are matrix row lines WL which are responsible both for those for this bank BK[0] and for the second bank BK[1] and on which the cells of the second bank BK[1] are seated.

Running over the cells of the second bank BK[1] in a third metalization plane E2 are column lines BL which are responsible both for those for this bank BK[1] and for the third bank BK[2] and on which the cells of the third bank BK[2] are seated. Running via the cells of the third bank BK[2] in a fourth metalization plane E3 are matrix row lines WL which are responsible both for those for this bank BK[2] and for the fourth bank BK[3] and on which the cells of the fourth bank BK[3] are seated.

Running over the cells of the fourth bank BK[3] in a fifth metalization plane E4 are column lines BL which are responsible both for those for this bank BK[3] and for the fifth bank BK[4] and on which the cells of the fifth bank BK[4] are seated. Running via the cells of the fifth bank BK[4] in a sixth metalization plane E5 are matrix row lines WL which are responsible only for this bank BK[2].

It is apparent that in a stack with the structure for the selection lines (column and matrix row lines) shown in FIG. 5, only k+1 metalization planes are necessary if k is the number of banks. This signifies a great saving over the cases shown in FIGS. 2 and 3, and thus a considerable reduction in the cost of manufacturing stacked memory banks. However, it is necessary to accept the fact that directly adjacent banks can no longer be operated completely separately and independently of one another. However, by skilful organization of the drive sequence it is possible to bring about a sufficiently large number of parallel access operations to fully exploit the improvement of the data rate which can be achieved with the invention.

It will be readily understood by those of skill in the pertinent art that the invention is not restricted to the embodiments described above and illustrated in FIGS. 2 to 5, which only refer to examples. Refinements and further variants are also possible within the scope of the inventive concept. Thus, if desired, not only the banks BK alone but also the drive circuits or elements of the same (in particular the sense amplifiers LV, the column-selection switches SS and also the local data lines LD with the data line switches DS) can be included in the stacking in order to reduce even further the differences in path lengths in the direction of the columns of the data line network. Instead of the MRAM banks, described with reference to FIGS. 4 and 5, as memories which can be read without damage it is possible also to apply the invention advantageously in other static RAMs.

We claim:

1. A data memory device, comprising:

a plurality of banks each containing a multiplicity of memory cells arranged in a matrix array of rows and columns and having respectively assigned matrix row lines and column lines, whereby said matrix row lines of each said bank are selectively activatable;

column-driving devices connected to ends of said column lines and each assigned to a respective said bank, said column-driving devices having, for each said column line, a selectively switchable column selection switch connected to transmit, in a switched-on state thereof, from or to an associated column-connecting node of a data line network, a data value to be written on or read out from the respective said column line;

said banks being spatially arranged one upon the other in separate planes to form bank stacks with edges extending parallel to said matrix rows and having said ends of said column lines connected to said column-driving devices, said edges lying in a common plane extending in the direction of said matrix rows and substantially orthogonally with respect to the direction of said columns; and said column-driving devices of all said banks being disposed directly adjacent one another as a block in the direction of said columns, on or near an edge of said bank stack at which said ends of said column lines connected to the column-driving devices are located.

2. The data memory device according to claim 1, wherein said memory cells are memory cells which can be read without damage, and wherein in each case a plurality of column lines are each assigned to one common sense amplifier in a respective said column-driving device at each bank, and wherein in each case one said column-selection switch is inserted between each column line and the associated said sense amplifier.

3. The data memory device according to claim 2, wherein said column lines are assigned to a sense amplifier in given numbers, and said given numbers are dimensioned such that an overall quantity of all said sense amplifiers are arranged along a row that extends in the direction of said matrix rows and that is no longer than a length of a matrix row, and wherein all said sense amplifiers are arranged next to one another along the edge of said bank stack.

4. The data memory device according to claim 2, wherein said memory cells are magnetoresistive memory cells.

5. The data memory device according to claim 1, wherein adjacent said banks in said bank stack are each assigned the same matrix row lines or column lines, and respective planes of said matrix row lines alternate with respective planes of said column lines in said bank stack.

* * * * *